US005283834A

United States Patent [19]

Goodman et al.

[11] Patent Number: 5,283,834

[45] Date of Patent: Feb. 1, 1994

[54] ACOUSTIC SYSTEM SUPPRESSING DETECTION OF HIGHER ORDER MODES

[75] Inventors: Seth D. Goodman; Kirk G. Burlage, both of Madison, Wis.

[73] Assignee: Nelson Industries, Inc., Stoughton, Wis.

[21] Appl. No.: 749,904

[22] Filed: Aug. 26, 1991

[51] Int. Cl.[5] ............ H03B 29/00

[52] U.S. Cl. ............ 381/71; 381/72; 381/94

[58] Field of Search ............ 381/71, 72, 94

[56] References Cited

U.S. PATENT DOCUMENTS 3,936,606 2/1976 Wanke .
4,044,203 8/1977 Swinbanks .
4,359,136 11/1982 Eriksson .
4,473,906 9/1984 Warnaka et al. .
4,527,282 7/1985 Chaplin et al. .
4,665,549 5/1987 Eriksson et al. .
4,677,676 6/1987 Eriksson .
4,677,677 6/1987 Eriksson .
4,697,668 10/1987 Barker .
4,703,506 10/1987 Sakamoto et al. ............ 381/92
4,736,431 5/1988 Allie et al. .
4,815,139 3/1989 Eriksson et al. .
4,837,834 6/1989 Allie .
4,872,528 10/1989 Goplen et al. .
4,987,598 1/1991 Eriksson .
5,022,082 6/1991 Eriksson .
5,033,082 7/1991 Eriksson .
5,091,954 2/1992 Sasaki et al. ............ 381/71

OTHER PUBLICATIONS

"A Study of Active Control of Noise in Ducts", J. Tichy et al, Journal of Vibration, Acoustics, Stress, and Reliability in Design, Jul. 1984, vol. 106, pp. 399–404.
"Higher Order Mode Cancellation in Ducts Using Active Noise Control", L. J. Eriksson et al, Inter-Noise 89, Newport Beach, Calif., Dec. 4–6, 1989, pp. 495–500.
"Higher Order Mode Effects in Circular Ducts and Expansion Chambers", L. J. Eriksson, J. Acoust. Soc. Am. 68(2), Aug. 1980, pp. 545–550.

*Primary Examiner*—John K. Peng
*Assistant Examiner*—Edward Lefkowitz
*Attorney, Agent, or Firm*—Andrus, Sceales, Starke & Sawall

[57] ABSTRACT

Detection of higher order mode transverse modal energy is suppressed for an acoustic wave propagating longitudinally through a duct. First and second microphones are placed in respective first and second nodal planes of the second higher order mode, and the outputs of the microphones are summed. For the first higher order mode, the output of the first microphone is equal in amplitude and opposite in phase to the output of the second microphone, and the resultant sum is zero. For the second higher order mode, the output of each of the first and second microphones is zero, and the resultant sum is zero.

42 Claims, 2 Drawing Sheets f < 94 HZ f > 94 HZ f >188 HZ

ACOUSTIC SYSTEM SUPPRESSING DETECTION OF HIGHER ORDER MODES

BACKGROUND AND SUMMARY

The invention relates to acoustic systems including a duct guiding an acoustic wave propagating longitudinally therethrough and having higher order mode transverse modal energy, and more particularly to a system suppressing detection of such energy.

The invention arose during continuing development efforts relating to active acoustic attenuation systems, including the subject matter shown and described in U.S. Pat. Nos. 4,665,549, 4,677,676, 4,677,677, 4,736,431, 4,815,139, 4,837,834, 4,987,598, 5,022,082, and 5,022,082, and allowed U.S. application Ser. No. 07/468,590, filed Jan. 23, 1990, all assigned to the assignee of the present invention and incorporated herein by reference.

A sound wave propagating axially through a rectangular duct has a cut-off frequency $f_c=c/2L$ where c is the speed of sound in the duct and L is the longer of the transverse dimensions of the duct. Acoustic frequencies below the cut-off frequency $f_c$ provide plane and uniform pressure acoustic waves extending transversely across the duct at a given instant in time. Acoustic frequencies above $f_c$ allow non-uniform pressure acoustic waves in the duct due to higher order modes.

For example, an air conditioning duct may have transverse dimensions of two feet by six feet. The longer transverse dimension is six feet. The speed of sound in air is 1,130 feet per second. Substituting these quantities into the above equation yields a cut-off frequency $f_c$ of 94 Hertz.

In circular ducts similar considerations apply when the duct diameter is approximately equal to one-half of the wavelength. Exact equations may be found in "Higher Order Mode Effects in Circular Ducts and Expansion Chambers", L. J. Eriksson, Journal of Acoustic Society of America, 68(2), August 1980, pp. 545–550.

Active attenuation involves injecting a canceling acoustic wave to destructively interfere with and cancel an input acoustic wave. In the given example, the acoustic wave can be presumed as a plane uniform pressure wave extending transversely across the duct at a given instant in time only at frequencies less than 94 Hertz. At frequencies less than 94 Hertz, there is less than a half wavelength across the longer transverse dimension of the duct. At frequencies above 94 Hertz, the wavelength becomes shorter and there is more than a half wavelength across the duct, i.e. a higher order mode with a non-uniform sound field may propagate through the duct.

In an active acoustic attenuation system, the output acoustic wave is sensed with an error microphone which supplies an error signal to a control model which in turn supplies a correction signal to a canceling loudspeaker which injects an acoustic wave to destructively interfere with the input acoustic wave and cancel same such that the output sound at the error microphone is zero. If the sound wave traveling through the duct is a plane wave having uniform pressure across the duct, then it does not matter where the canceling speaker and error microphone are placed along the cross section of the duct. In the above example for a two foot by six foot duct, if a plane wave with uniform pressure is desired, the acoustic frequency must be below 94 Hertz. If it is desired to attenuate higher frequencies using plane uniform pressure waves, then the duct must be split into separate ducts of smaller cross section or the duct must be partitioned into separate chambers to reduce the longer transverse dimension L to less than c/2f at the frequency f that is to be attenuated.

In the above example, splitting the duct into two separate ducts with a central partition would yield a pair of ducts each having transverse dimensions of two feet by three feet. Each duct would have a cut-off frequency $f_c$ of 188 Hertz.

The above noted approach to increasing the cut-off frequency $f_c$ is not economically practicable because active acoustic attenuation systems are often retrofitted to existing ductwork, and it is not economically feasible to replace an entire duct with separate smaller ducts or to insert partitions extending through the duct to provide separate ducts or chambers.

One solution to the above noted problem is shown and described in above incorporated U.S. Pat. No. 4,815,139. The present invention provides another solution.

In the present invention, higher order modes are permitted in the duct, but measurement thereof is prevented, or at least minimized. Rather than allowing the control system to observe transverse energy which it cannot control, the invention instead suppresses detection of transverse modal energy to avoid observation thereof. Since the control system does not observe higher order modes, it does not generate same.

The invention can be used with modes that have non-uniform pressure distribution in both transverse dimensions of a rectangular or other shape duct. The invention may also be used with modes that have non-uniform pressure distribution in both the radial and circumferential dimensions of a circular duct. The invention has application in areas other than active noise control, for example active vibration control, impedance tube acoustical measurements, or other applications where it is desired to suppress detection of higher order modes.

DETAILED DESCRIPTION

Figure 1:
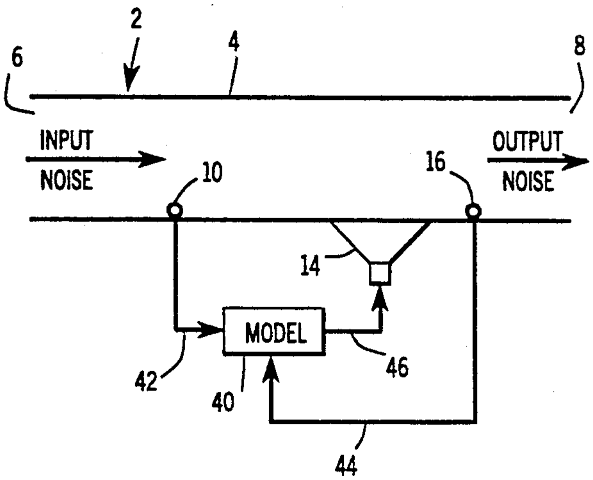
FIG. 1 is a schematic illustration of an acoustic modeling system in accordance with the above noted incorporated U.S. Pat. Nos. 4,677,676 and 4,677,677.

FIG. 1 shows a modeling system in accordance with incorporated U.S. Pat. No. 4,677,677, FIG. 5, and like reference numerals are used from said patent where appropriate to facilitate clarity. The acoustic system 2 includes an axially extending duct 4 having an input 6 for receiving input noise and an output 8 for radiating or outputting output noise. The acoustic wave providing the noise propagates axially left to right through the duct. The acoustic system is modeled with an adaptive filter model 40 having a model input 42 from input microphone or transducer 10 and an error input 44 from error microphone or transducer 16, and outputting a correction signal at 46 to omnidirectional output speaker or transducer 14 to introduce canceling sound waves such that the error signal at 44 approaches a given value such as zero. The canceling acoustic wave from speaker 14 is introduced into duct 4 for attenuating the output acoustic wave. Error microphone 16 senses the combined output acoustic wave and canceling acoustic wave and provides an error signal at 44. The acoustic system is modeled with an adaptive filter model 40, as in the noted incorporated patents. The input acoustic wave is sensed with input microphone 10, or alternatively an input signal is provided at 42 from a tachometer or the like which gives the frequency of a periodic input acoustic wave, such as from an engine or the like, without actually measuring or sensing such noise.

Figure 2:
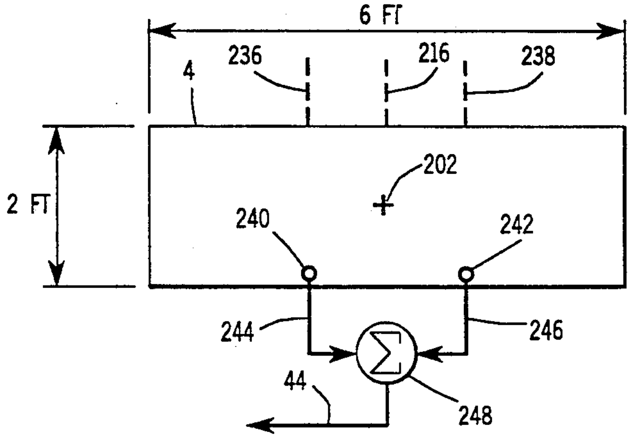
FIG. 2 is an end view of the duct of FIG. 1 and shows the acoustic pressure distribution of the plane wave mode.

FIG. 2 shows an end view of duct 4 at a given instant in time for the above noted example, where the duct has transverse dimensions of two feet by six feet. The cut-off frequency $f_c$ of the acoustic wave travelling axially in the duct (out of the page in FIG. 2) is given by $f_c=c/2L$, where $f_c$ is the cut-off frequency, c is the speed of sound in the duct, and L is the longer of the transverse dimensions of the duct, namely six feet. Thus in the example given, $f_c=94$ Hertz. Acoustic frequencies below 94 Hertz provide plane and uniform pressure acoustic waves in the duct. In FIG. 2, the plane wave has a positive pressure across the entire transverse dimension of the duct at a given instant in time as shown at the plus sign 202.

Figure 3:
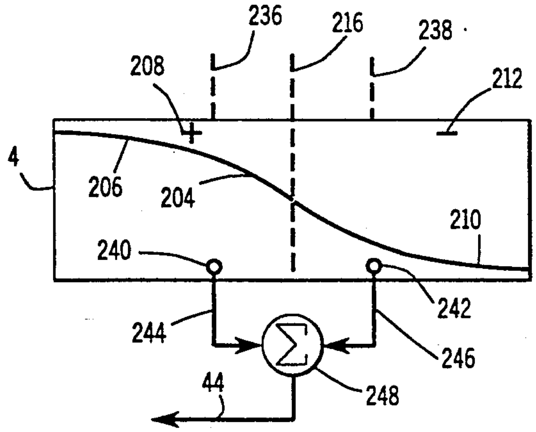
FIG. 3 is a view like FIG. 2 and shows the acoustic pressure distribution of the first higher order mode.

At acoustic frequencies greater than $f_c$, there may be a non-uniform acoustic pressure wave at a given instant in time across the duct due to higher order modes. This is because the transverse dimension of the duct is greater than one-half the wavelength of the acoustic wave. FIG. 3 shows the first higher order mode wherein the acoustic frequency is greater than $f_c$. In the example shown, for a two foot by six foot duct, the acoustic frequency is greater than 94 Hertz. The acoustic wave 204 has a positive pressure portion 206 shown at plus sign 208, and a negative pressure portion 210 shown at minus sign 212. The first higher order mode has a zero-pressure nodal plane 216 between the positive and negative pressure portions.

Figure 4:
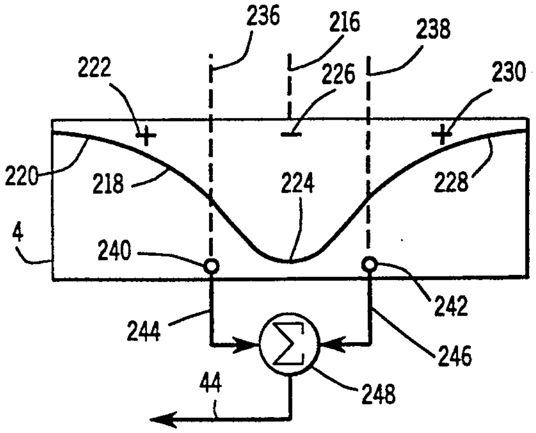
FIG. 4 is a view like FIG. 2 and shows the acoustic pressure distribution of the second higher order mode.

FIG. 4 shows the second higher order mode with an acoustic wave 218 having a positive pressure portion 220 shown at plus sign 222, a negative pressure portion 224 shown at minus sign 226, and a positive pressure portion 228 shown at plus sign 230, separated by respective zero-pressure nodal planes 236 and 238 at a given instant in time. The acoustic frequency is greater than 2 $f_c$, i.e. greater than 188 Hertz for a two foot by six foot duct. In the second higher order mode, there are two zero-pressure nodal planes, 236 and 238, each between portions of positive and negative pressure. Further higher order modes continue in like manner. For example, the third higher order mode associated with the transverse dimension L has four portions separated by three zero-pressure nodal planes at a given instant in time.

In FIGS. 2–4, a second input microphone is provided, in addition to input microphone 10. The two input microphones are designated 240 and 242 in FIGS. 2–4. Input microphone 240 is placed in nodal plane 236 of the second higher order mode. Input microphone 242 is placed in nodal plane 238 of the second higher order mode. Each of planes 236 and 238 extends through the duct and normal to the largest transverse dimension L of the duct, e.g. the six foot dimension in the example shown, such that in the orientation shown in FIGS. 2–4, planes 236 and 238 extend vertically and also extend into and out of the page. Nodal planes 236 and 238 are parallel to each other and to nodal plane 216 of the first higher order mode and are equally spaced on opposite sides of nodal plane 216. In locating the microphones across the duct and along the respective nodal plane, the microphones are preferably placed at the sidewall of the duct, either just inside the duct, or just outside the duct and communicating through an appropriate aperture, to eliminate the need to place a microphone within the interior of the duct, which placement is more costly and presents a resistance to flow.

The outputs 244 and 246 of respective microphones 240 and 242 are summed at summer 248, and the result is provided as the error input 44 to model 40, FIG. 1. For the first higher order mode, FIG. 3, the output of microphone 240 is equal in amplitude and opposite in phase to the output of microphone 242, and the resultant sum is zero. For the second higher order mode, FIG. 4, the output of each of microphones 240 and 242 is zero, and the resultant sum is zero. The system thus suppresses detection of higher order mode transverse modal energy of the acoustic wave propagating longitudinally through duct 4 by placing microphones such that the sum of the outputs of the microphones is zero for both the first and second higher order modes. For the first higher order mode, the resultant sum is zero because the microphones are equally spaced on opposite sides of the nodal plane 216 of the first higher order mode, and the output of the first microphone is equal in amplitude and opposite in phase to the output of the second microphone. For the second higher order mode, the resultant sum is zero because the output of each microphone is zero because each microphone is in a respective nodal plane 236, 238 of the second higher order mode.

In a further embodiment, a second error microphone is provided, in addition to error microphone 16, and the two error microphones are placed along respective nodal planes 236 and 238.

Figure 5:
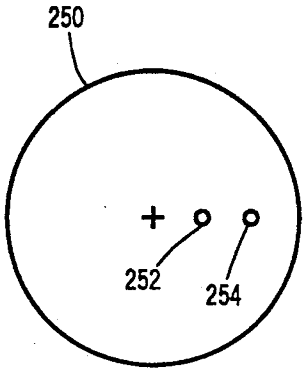
FIG. 5 is an end view of a circular duct and shows the acoustic pressure distribution of the plane wave mode.
Figure 6:
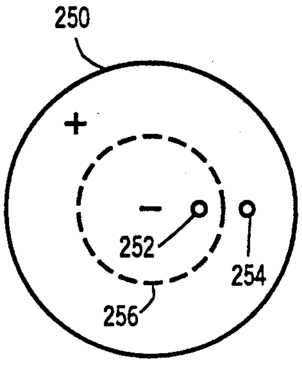
FIG. 6 is a view like FIG. 5 and shows the acoustic pressure distribution of the first higher order mode in the radial dimension.
Figure 7:
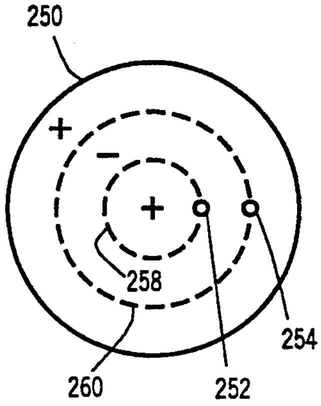
FIG. 7 is a view like FIG. 5 and shows the acoustic pressure distribution of the second higher order mode in the radial dimension.
Figure 8:
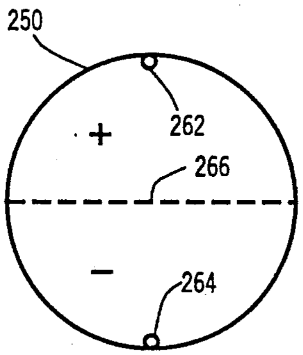
FIG. 8 is a view like FIG. 5 and shows the acoustic pressure distribution of the first higher order mode in the circumferential dimension.
Figure 9:
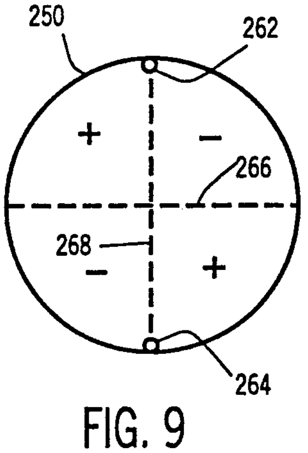
FIG. 9 is a view like FIG. 5 and shows the acoustic pressure distribution of the second higher order mode in the circumferential dimension.

In FIGS. 5–7, showing a round duct 250, microphones 252 and 254 are equally spaced on opposite sides of nodal plane 256 of the first higher order mode, FIG. 6, in combination with placing microphones 252 and 254 in respective nodal planes 258 and 260 of the second higher order mode, FIG. 7. In FIGS. 8 and 9, microphones 262 and 264 are equally spaced on opposite sides of nodal plane 266 of the first higher order mode, FIG. 8, in combination with placing the microphones in the same nodal plane 268 of the second higher order mode, FIG. 9.

In general, the system shown and described may be used in applications where it is desired to suppress detection of higher order modes of an elastic wave propagating in an elastic medium, where the elastic wave may have nonuniform pressure distribution in the medium at a given instant in time along a direction transverse to the direction of propagation. The term acoustic wave includes any such elastic wave, and the term waveguide includes any structure for guiding the acoustic wave therealong in an elastic medium, including solid, liquid or gas. For example, waveguides include ducts, impedance tubes, and vibrational structures such as beams, plates, etc. The acoustic wave is sensed with an acoustic sensor, such as a microphone, an accelerometer in vibration applications, etc.

It is recognized that various equivalents, alternatives and modifications are possible within the scope of the appended claims.

We claim:

1. A method for suppressing detection of higher order mode transverse modal energy of an acoustic wave propagating longitudinally along a waveguide, comprising placing a plurality of acoustic sensors at designated locations across said waveguide and summing the outputs of said acoustic sensors such that the resultant sum is zero for a given higher order mode.

2. The method according to claim 1 comprising placing said plurality of acoustic sensors at respective designated locations different than a nodal plane of said given higher order mode.

3. The method according to claim 1 comprising placing said plurality of acoustic sensors along respective nodal planes different than a nodal plane of said given higher order mode.

4. The method according to claim 1 comprising equally spacing first and second acoustic sensors on opposite sides of a nodal plane of said given higher order mode, and summing the outputs of said first and second acoustic sensors such that for said given higher order mode the output of said first acoustic sensor is equal in amplitude and opposite in phase to the output of said second acoustic sensor and the resultant sum is zero.

5. The method according to claim 1 wherein said given higher order mode is the first higher order mode.

6. A method for suppressing detection of higher order mode transverse modal energy of an acoustic wave propagating longitudinally along a waveguide, comprising placing a plurality of acoustic sensors at designated locations across said waveguide and summing the outputs of said acoustic sensors such that the resultant sum is zero for a plurality of higher order modes.

7. The method according to claim 6 comprising summing the outputs of said acoustic sensors such that the resultant sum is zero for at least one higher order mode having an odd number of nodal planes, and such that the sum is also zero for at least another higher order mode having an even number of nodal planes.

8. The method according to claim 6 comprising placing first and second acoustic sensors at respective designated locations and summing the outputs thereof such that for one of said higher order modes the output of said first acoustic sensor is equal in amplitude and opposite in phase to the output of said second acoustic sensor and the resultant sum is zero, and such that for another of said higher order modes the output of each of said first and second acoustic sensors is zero and the resultant sum is zero.

9. The method according to claim 8 comprising placing said first and second acoustic sensors at respective designated locations different than a nodal plane of said one higher order mode.

10. The method according to claim 8 comprising placing said first and second acoustic sensors along respective nodal planes different than a nodal plane of said one higher order mode.

11. The method according to claim 8 comprising placing said first and second acoustic sensors along respective nodal planes of said other higher order mode and different than a nodal plane of said one higher order mode.

12. The method according to claim 8 comprising equally spacing said first and second acoustic sensors on opposite sides of a nodal plane of said one higher order mode in combination with placing said first and second acoustic sensors in different nodal planes of said other higher order mode.

13. The method according to claim 12 wherein said waveguide is rectangular in cross section.

14. The method according to claim 12 wherein said waveguide is circular in cross section.

15. The method according to claim 8 comprising equally spacing said first and second acoustic sensors on opposite sides of a nodal plane of said one higher order mode in combination with placing said first and second acoustic sensors in the same nodal plane of said other higher order mode.

16. The method according to claim 15 wherein said waveguide is circular in cross section.

17. The method according to claim 8 wherein said one higher order mode is the first higher order mode, and said other higher order mode is the second higher order mode.

18. A method for suppressing detection of higher order mode transverse modal energy of an acoustic wave propagating longitudinally along a waveguide, comprising placing first and second acoustic sensors along respective nodal planes of a higher order mode having an even number of nodal planes, and summing the outputs of said first and second acoustic sensors such that for a higher order mode having an odd number of nodal planes, the output of said first acoustic sensor is equal in amplitude and opposite in phase to the output of said second acoustic sensor and the resultant sum is zero, and such that for a higher order mode having an even number of nodal planes, the output of each of said first and second acoustic sensors is zero and the resultant sum is zero.

19. A method for suppressing detection of higher order mode transverse modal energy of an acoustic wave propagating longitudinally along a waveguide, comprising placing first and second acoustic sensors in respective first and second nodal planes of the second higher order mode, and summing the outputs of said first and second acoustic sensors such that the resultant sum is zero for both the first and second higher order modes.

20. The method according to claim 19 comprising summing the outputs of said first and second acoustic sensors such that for the first higher order mode the output of said first acoustic sensor is equal in amplitude and opposite in phase to the output of said second acoustic sensor and the resultant sum is zero, and such that for the second higher order mode the output of each of said first and second acoustic sensors is zero and the resultant sum is zero.

21. A method for suppressing detection of higher order mode transverse modal energy in an acoustic system having a duct guiding an acoustic wave propagating longitudinally therethrough, said duct having a transverse dimension determining the cut-off frequency of said acoustic wave, such that acoustic waves of frequencies below said cut-off frequency have uniform pressure distribution across said transverse dimension at a given instant in time, and acoustic waves of frequencies above said cut-off frequency have non-uniform pressure distribution across said transverse dimension at a given instant in time, including a first higher order mode having a zero-pressure nodal plane between portions of positive and negative pressure and extending through said duct and normal to said transverse dimension, and a second higher order mode having first and second zero-pressure nodal planes, each between portions of positive and negative pressure and extending through said duct and normal to said transverse dimension, said first and second nodal planes of said second higher order mode being parallel and equally spaced on opposite sides of said nodal plane of said first higher order mode, said method comprising placing a first microphone in said first nodal plane of said second higher order mode, placing a second microphone in said second nodal plane of said second higher order mode, summing the outputs of said first and second microphones such that for the first higher order mode the output of said first microphone is equal in amplitude and opposite in phase to the output of said second microphone and the resultant sum is zero, and such that for the second higher order mode the output of each of said first and second microphones is zero and the resultant sum is zero.

22. In an active acoustic attenuation system for attenuating an acoustic wave in an acoustic system including an axially extending duct having an input for receiving an input acoustic wave and an output for radiating an output acoustic wave, said acoustic wave propagating axially through said duct, said duct having a higher order mode cut-off frequency $f_c$, wherein acoustic frequencies below $f_c$ provide plane and uniform pressure acoustic waves transversely across said duct at a given instant in time, a method for actively attenuating said output acoustic wave by introducing a canceling acoustic wave from a canceling speaker and for suppressing detection of higher order mode transverse modal energy, while still permitting the existence of such higher order mode transverse modal energy in said duct and without increasing $f_c$ or otherwise splitting said duct into separate ducts or partitioning said duct into separate chambers, said method comprising:

sensing the input acoustic wave with first and second input microphones equally spaced on opposite sides of a nodal plane of one higher order mode, and summing the outputs of said first and second input microphones such that for said one higher order mode the output of said first input microphone is equal in amplitude and opposite in phase to the output of said second input microphone and the resultant sum is zero, and such that for another higher order mode the output of each of said first and second input microphones is zero and the resultant sum is zero;

sensing the output acoustic wave with an error microphone providing an error signal;

modeling said acoustic system with an adaptive filter model having a model input from the sum of the outputs of said first and second input microphones, and an error input from the error signal, and outputting a correction signal to said canceling speaker to introduce the canceling acoustic wave.

23. Apparatus for suppressing detection of higher order mode transverse modal energy of an acoustic wave propagating longitudinally along a waveguide, comprising a plurality of acoustic sensors placed at designated locations across said waveguide, and a summer summing the outputs of said acoustic sensors such that the resultant sum is zero for a given higher order mode.

24. The apparatus according to claim 23 wherein said acoustic sensors are placed at respective designated locations different than a nodal plane of said given higher order mode.

25. The apparatus according to claim 23 wherein said acoustic sensors are placed along respective nodal planes different than a nodal plane of said given higher order mode.

26. The apparatus according to claim 23 wherein said plurality of acoustic sensors comprises first and second acoustic sensors equally spaced on opposite sides of a nodal plane of said given higher order mode, and wherein said summer sums the outputs of said first and second acoustic sensors such that for said given higher order mode the output of said first acoustic sensor is equal in amplitude and opposite in phase to the output of said second acoustic sensor and the resultant sum is zero.

27. The apparatus according to claim 23 wherein said given higher order mode is the first higher order mode.

28. Apparatus for suppressing detection of higher order mode transverse modal energy of an acoustic wave propagating longitudinally along a waveguide, comprising a plurality of acoustic sensors placed at designated locations across said waveguide, and a summer summing the outputs of said acoustic sensors such that the resultant sum is zero for a plurality of higher order modes.

29. The apparatus according to claim 28 wherein said resultant sum is zero for at least one higher order mode having an odd number of nodal planes, and said sum is also zero for at least another higher order mode having an even number of nodal planes.

30. The apparatus according to claim 28 wherein said plurality of acoustic sensors comprises first and second acoustic sensors, and wherein said summer sums the outputs of said first and second acoustic sensors such that for one of said higher order modes the output of said first acoustic sensor is equal in amplitude and opposite in phase to the output of said second acoustic sensor and the resultant sum is zero, and such that for another of said higher order modes the output of each of said first and second acoustic sensors is zero and the resultant sum is zero.

31. The apparatus according to claim 30 wherein said first and second acoustic sensors are placed at designated locations different than a nodal plane of said one higher order mode.

32. The apparatus according to claim 30 wherein said first and second acoustic sensors are placed along respective nodal planes different than a nodal plane of said one higher order mode.

33. The apparatus according to claim 30 wherein said first and second acoustic sensors are placed along respective nodal planes of said other higher order mode and different than a nodal plane of said one higher order mode.

34. The apparatus according to claim 30 wherein said first and second acoustic sensors are equally spaced on opposite sides of a nodal plane of said one higher order mode, and wherein said first and second acoustic sensors are in different nodal planes of said other higher order mode.

35. The apparatus according to claim 34 wherein said waveguide is rectangular in cross section.

36. The apparatus according to claim 34 wherein said waveguide is circular in cross section.

37. The apparatus according to claim 30 wherein said first and second acoustic sensors are equally spaced on opposite sides of a nodal plane of said one higher order mode, and wherein said first and second acoustic sensors are in the same nodal plane of said other higher order mode.

38. The apparatus according to claim 37 wherein said waveguide is circular in cross section.

39. The apparatus according to claim 30 wherein said one higher order mode is the first higher order mode, and said other higher order mode is the second higher order mode.

40. Apparatus for suppressing detection of higher order mode transverse modal energy of an acoustic wave propagating longitudinally along a waveguide, comprising first and second acoustic sensors placed in respective first and second nodal planes of the second higher order mode, and a summer summing the outputs of said first and second acoustic sensors such that the resultant sum is zero for both the first and second higher order modes.

41. The apparatus according to claim 40 wherein said summer sums the outputs of said first and second acoustic sensors such that for the first higher order mode the output of said first acoustic sensor is equal in amplitude and opposite in phase to the output of said second acoustic sensor and the resultant sum is zero, and such that for the second higher order mode the output of each of said first and second acoustic sensors is zero and the resultant sum is zero.

42. Apparatus for suppressing detection of higher order mode transverse modal energy of an acoustic wave propagating longitudinally through a duct, said duct having a transverse dimension determining the cut-off frequency of said acoustic wave, such that acoustic waves of frequencies below said cut-off frequency have uniform pressure distribution across said transverse dimension at a given instant in time, and acoustic waves of frequencies above said cut-off frequency have non-uniform pressure distribution across said transverse dimension at a given instant in time, including a first higher order mode having a zero-pressure nodal plane between portions of positive and negative pressure and extending through said duct and normal to said transverse dimension, and a second higher order mode having first and second zero-pressure nodal planes, each between portions of positive and negative pressure and extending through said duct and normal to said transverse dimension, said first and second nodal planes of said second higher order mode being parallel and equally spaced on opposite sides of said nodal plane of said first higher order mode, said apparatus comprising a first microphone placed in said first nodal plane of said second higher order mode, a second microphone placed in said second nodal plane of said second higher order mode, a summer summing the outputs of said first and second microphones such that for the first higher order mode the output of said first microphone is equal in amplitude and opposite in phase to the output of said second microphone and the resultant sum is zero, and such that for the second higher order mode the output of each of said first and second microphones is zero and the resultant sum is zero.

* * * * *